(12) United States Patent
Cheng et al.

(10) Patent No.: US 9,328,419 B2
(45) Date of Patent: *May 3, 2016

(54) GAS TREATMENT APPARATUS WITH SURROUNDING SPRAY CURTAINS

(75) Inventors: Jui-Sheng Cheng, Tainan (TW); Tsung-Hsun Han, Kaohsiung (TW)

(73) Assignee: Hermes-Epitek Corporation, Taipei (TW)

( * ) Notice: Subject to any disclaimer, the term of this patent is extended or adjusted under 35 U.S.C. 154(b) by 653 days.

This patent is subject to a terminal disclaimer.

(21) Appl. No.: 13/450,341

(22) Filed: Apr. 18, 2012

(65) Prior Publication Data

US 2013/0276703 A1    Oct. 24, 2013

(51) Int. Cl.
  *C23C 16/455*    (2006.01)
  *H01L 21/67*    (2006.01)

(52) U.S. Cl.
  CPC ..... *C23C 16/45565* (2013.01); *C23C 16/45572* (2013.01); *C23C 16/45574* (2013.01); *H01L 21/67109* (2013.01)

(58) Field of Classification Search
  None
  See application file for complete search history.

(56) References Cited

U.S. PATENT DOCUMENTS

| | | | | |
|---|---|---|---|---|
| 6,387,182 | B1* | 5/2002 | Horie et al. | 118/244 |
| 2004/0083959 | A1* | 5/2004 | Carpenter | C23C 16/45519 118/715 |
| 2007/0163440 | A1 | 7/2007 | Kim et al. | |
| 2008/0173735 | A1* | 7/2008 | Mitrovic et al. | 239/548 |
| 2009/0095222 | A1 | 4/2009 | Tam et al. | |
| 2009/0098276 | A1 | 4/2009 | Burrows et al. | |
| 2009/0178615 | A1* | 7/2009 | Kim et al. | 118/715 |
| 2009/0266911 | A1* | 10/2009 | Kim | C23C 16/45514 239/265.11 |

* cited by examiner

*Primary Examiner* — Joseph Miller, Jr.
(74) *Attorney, Agent, or Firm* — Donald E. Stout; Stout, Uxa & Buyan, LLP

(57) ABSTRACT

The invention provides a gas treatment apparatus comprising an exterior circular gas spray portion including an exterior circular gas channel, and at least two regions and a cover. Each region has an upper gas spray portion and a lower gas spray portion. The upper gas spray portion has a plurality of first gas channels and a plurality of first heat exchange fluid conduits, each the first gas channel is arranged interlaced with each the first heat exchange fluid conduit. The lower gas spray portion comprises a plurality of second gas channels and a plurality of second heat exchange fluid conduits, each the second gas channel is arranged interlaced with each the second heat exchange fluid conduit, and each the second gas channel surrounds each the first gas channel. The combinations of the first gas channels and the second gas channels in adjacent regions respectively are arranged at an angle.

20 Claims, 4 Drawing Sheets

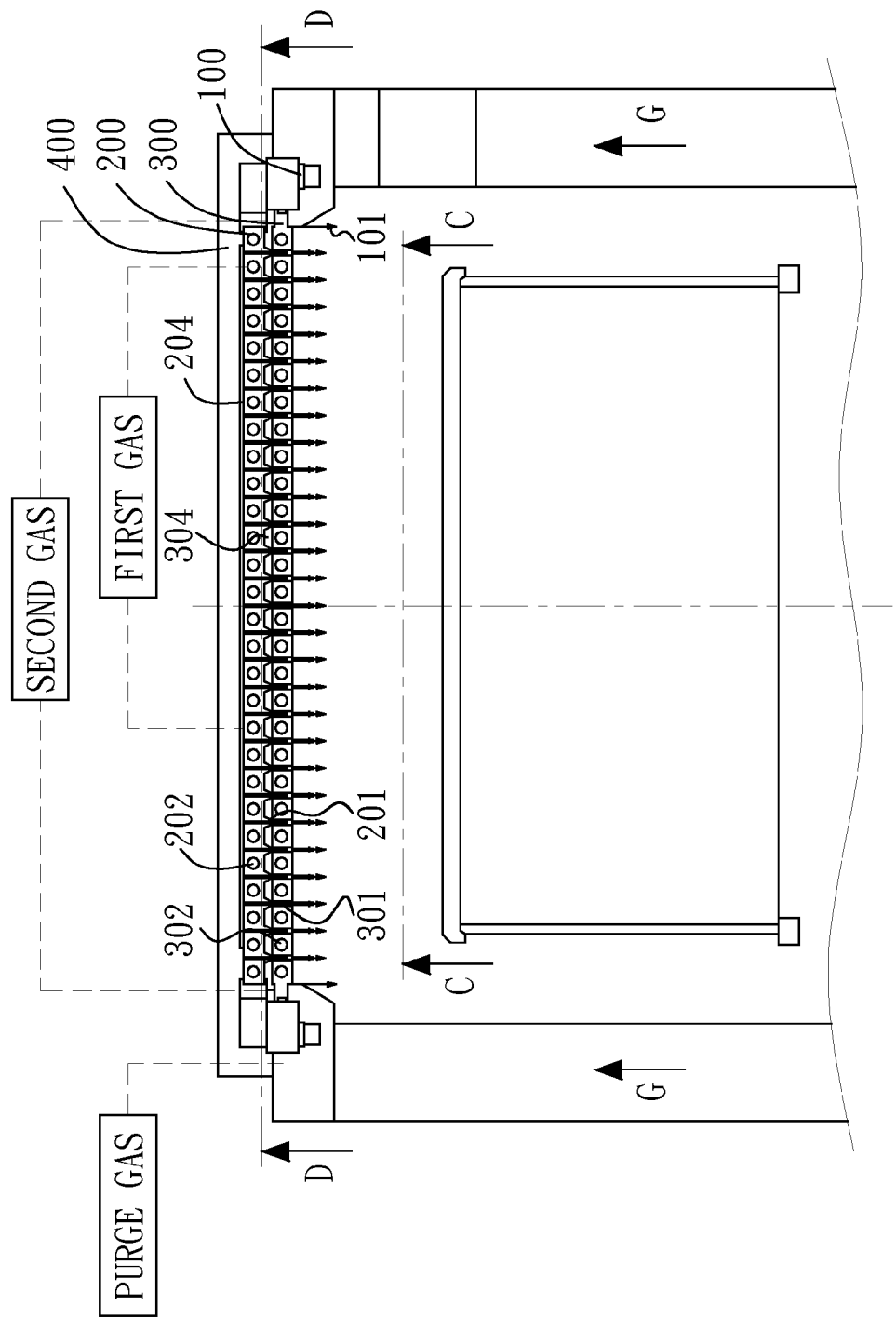

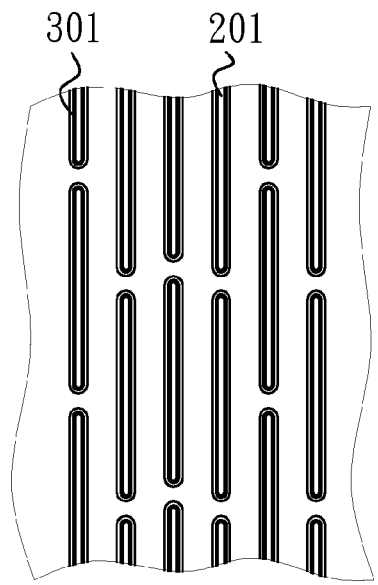
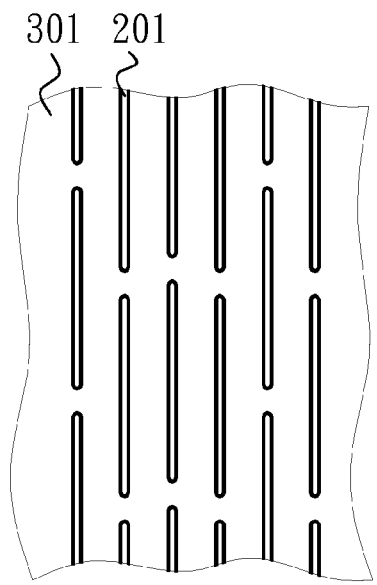
FIG.1C  FIG.1D
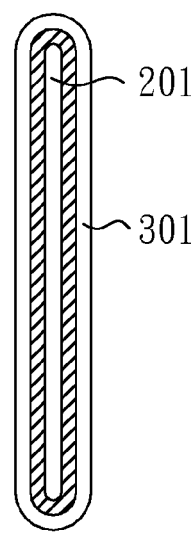
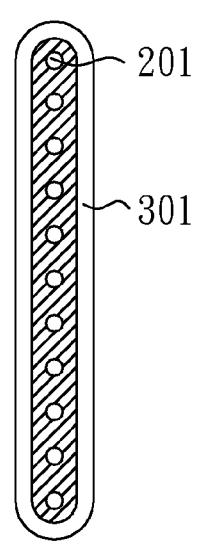
FIG.1E  FIG.1F

GAS TREATMENT APPARATUS WITH SURROUNDING SPRAY CURTAINS

BACKGROUND OF THE INVENTION

1. Field of the Invention

The present invention generally relates to an apparatus for gas treatment, and more particularly to a gas treatment apparatus with surrounding spray curtains.

2. Description of Related Art

In semiconductor manufacturing processes such as thin film deposition processes or chemical vapor deposition (CVD) processes are carried out inside a chamber provided with a showerhead, wherein semiconductor wafers are placed on a wafer carrier with a heating function and the showerhead sprays reaction gases required for the processes into the chamber and over the semiconductor wafers on the wafer carrier. When reaction gases such as precursor gases containing materials to be deposited are sprayed onto the semiconductor wafers through the showerhead in a gas state, a chemical reaction occurs within the chamber, and thus the thin film is formed. During the chemical reaction, a high temperature must be maintained inside the chamber for the chemical reaction.

The showerhead usually has a gas distribution injector for directing the precursor gases towards the wafer carrier in the chamber where the semiconductor wafers can be treated for processes. Ideally, the precursor gases are directed at the wafer carrier such that the precursor gases react as close to the wafer and distribute as uniform as possible over the semiconductor wafers.

In many metal organic chemical vapor deposition (MOCVD) processes, for example, combinations of precursor gases comprised of metal organics and hydrides, such as ammonia or arsine, are introduced into a chamber through the showerhead. Process-facilitating carrier gases, such as inert gases, argon or helium, also may be introduced into the chamber through the showerhead. The precursor gases mix in the chamber and react to form a thin film on a semiconductor wafer held within the chamber. The carrier gases typically aid in maintaining laminar flow at the wafer carrier.

However, many existing showerheads have problems that may interfere with efficient operation or uniform deposition due to the design of gas channel. For example, gas spray in existing showerhead may induce significant space in the chamber without effective gas flow from the gas vents of the showerhead to the semiconductor wafer resulting in a non-uniform distribution of gases.

The non-uniform distribution of gases may cause unwanted deposition or non-uniform deposition. Such unwanted deposition consumes reactants and decreases the efficiency and the non-uniform deposition would further reduce the throughput of the process. Thus, many current systems require frequent cleaning of the reactor, which further reduces productivity.

Since a high temperature must be maintained inside the chamber for the chemical reaction, uniform and efficient cooling channel design is crucial for maintaining the efficiency, throughput and productivity of the reactor. Some existing showerheads also have problems of efficient operation or uniform deposition due to the cooling design. Owing to the inefficient cooling design, the formation of condensates on the showerhead as well as gas phase particle formation and the production of undesirable precursor reactant products may adversely affect the composition of the thin film deposited on the semiconductor wafers. In U.S. Patent Application No. 20070163440, the gas separation type showerhead which separately provides two different gases without cooling design might cause reaction and undesirable deposition on the holes and vents and form obstacles to the gas flows. In U.S. Pat. No. 7,976,631, each the heat exchanging channel of the showerhead is arranged only adjacent to one side of two adjacent gas channels and such cooling design obviously cannot provide uniform heat exchange. In U.S. Patent Application No. 20090095222, the gas mixing channel and the heat exchanging channel of the showerhead both are spiral channels wherein the gas mixing channel is disposed adjacent to the heat exchanging channel. The heat exchanging channel is also arranged only adjacent to one side of two adjacent gas channels and this inefficient cooling design would result in the formation of condensates on the showerhead as well as gas phase particle formation.

Therefore, there is a need for an improved deposition apparatus and process that can provide uniform thin film deposition and heat exchanging performance.

SUMMARY OF THE INVENTION

One embodiment of the invention provides a gas treatment apparatus which comprises an exterior circular gas spray portion including an exterior circular gas channel, at least two regions, and a cover on the exterior circular gas spray portion and the regions. Each region has an upper gas spray portion having a first plenum, a plurality of first gas channels and a plurality of first heat exchange fluid conduits, and a lower gas spray portion comprising a second plenum, a plurality of second gas channels, the first gas channels and a plurality of second heat exchange fluid conduits. The first plenum is located above the first heat exchange fluid conduits, the first plenum connects to a gas delivery apparatus, the first heat exchange fluid conduits are arranged in substantially parallel to each other throughout the upper gas spray portion, each the first gas channel is arranged interlaced with each the first heat exchange fluid conduit. The second plenum is located under the first heat exchange fluid conduits and above the second heat exchange fluid conduits, the second plenum connects to the gas delivery apparatus, the second heat exchange fluid conduits are arranged in substantially parallel to each other throughout the lower gas spray portion, each the second gas channel surrounds each the first gas channel and both are arranged interlaced with each the second heat exchange fluid conduit, and the second gas channels connect the second plenum to the processing volume, each the second gas channel surrounds each the first gas channel to form a combination of the first gas channel and the second gas channel. The combinations of the first gas channels and the second gas channels in adjacent regions respectively are arranged at an angle.

Another embodiment of the present invention provides a deposition system which comprises a chamber enclosing a processing volume, a gas delivery apparatus and a gas treatment apparatus. The gas treatment apparatus comprises an exterior circular gas spray portion including an exterior circular gas channel, at least two regions, and a cover on the exterior circular gas spray portion and the regions. Each region has an upper gas spray portion, and a lower gas spray portion. The upper gas spray portion has a first plenum, a plurality of first gas channels and a plurality of first heat exchange fluid conduits, wherein the first plenum is located above the first heat exchange fluid conduits, the first plenum connects to the gas delivery apparatus, the first heat exchange fluid conduits are arranged in substantially parallel to each other throughout the upper gas spray portion, each the first gas channel is arranged interlaced with each the first heat exchange fluid conduit, the first gas channels connect the first plenum to the processing volume of the chamber. The lower gas spray portion comprises a second plenum, a plurality of second gas channels, the first gas channels and a plurality of second heat exchange fluid conduits, wherein the second plenum is located under the first heat exchange fluid conduits and above the second heat exchange fluid conduits, the second plenum connects to the gas delivery apparatus, the second heat exchange fluid conduits are arranged in substantially parallel to each other throughout the lower gas spray portion, each the second gas channel surrounds each the first gas channel and both are arranged interlaced with each the second heat exchange fluid conduit, and the second gas channels connect the second plenum, each the second gas channel surrounds each the first gas channel.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a cross-sectional view of the gas treatment apparatus with surrounding spray curtains of the deposition system of one embodiment of the invention;

FIG. 1C is a partial and sectional view taken along line C-C in FIG. 1;

FIG. 1D is a partial and sectional view taken along line D-D in FIG. 1;

FIG. 1E and FIG. 1F show two embodiments of the first gas channel and the second gas channel respectively.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION OF THE INVENTION

Figure 1A:
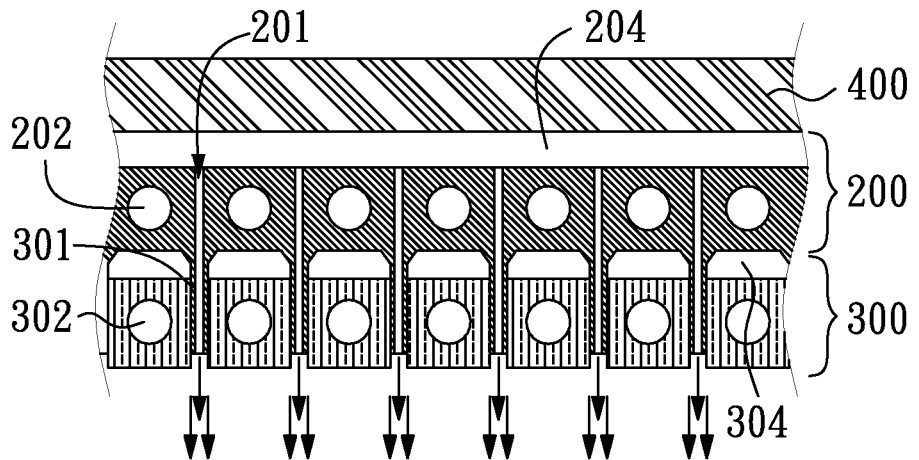
FIG. 1A is a detailed cross-sectional view of the gas treatment apparatus shown in FIG. 1 according to one embodiment of the invention.

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations and elements are not described in detail in order not to unnecessarily obscure the present invention.

One embodiment of the invention generally provides a deposition system with a gas treatment apparatus with surrounding spray curtains. The deposition system comprising a chamber enclosing a processing volume, a gas delivery apparatus and the gas treatment apparatus with surrounding spray curtains may be utilized for thin films deposition process of MOCVD. Although the embodiments of the gas treatment apparatus described herein may be adapted for use in MOCVD applications, it is noted that the embodiments can also be used in another deposition technique.

The gas treatment apparatus with surrounding spray curtains is disposed at one end of the processing volume, and a substrate carrier is disposed at the other end of the processing volume. The substrate carrier is for holding at least one substrate which is loaded thereon for processing. Typical substrates loaded for processing in the deposition system includes silicon wafer, sapphire substrate, silicon carbide (SiC) substrate, or gallium nitride (GaN) or III-V semiconductor substrate, etc. It is to be understood that other types of substrates, such as glass substrates, may be processed in the deposition system. It is noted that any suitable designs of the chamber enclosing a processing volume and the gas delivery apparatus of the deposition system could be used in the deposition system and thus no particular examples will be specifically described and shown herein. The deposition system could further include other necessary devices or elements which are obvious for those with ordinary skill in the art. However, some apparatus or device which relates to the gas treatment apparatus with surrounding spray curtains will be mentioned in the following description.

FIG. 1 is a cross-sectional view of the gas treatment apparatus with surrounding spray curtains of the deposition system of one embodiment of the invention. The gas treatment apparatus with surrounding spray curtains is located above the substrate during thin film deposition processes. In one embodiment, the gas treatment apparatus with surrounding spray curtains comprises an exterior circular gas spray portion 100, an upper gas spray portion 200, a lower gas spray portion 300 and a cover 400. The exterior circular gas spray portion 100 comprises an exterior circular gas channel 101. The upper gas spray portion 200 includes a first plenum 204, a plurality of first gas channels 201 and a plurality of first heat exchange fluid conduits 202. The lower gas spray portion 300 comprises a second plenum 304, a plurality of second gas channels 301, the first gas channels 201 and a plurality of second heat exchange fluid conduits 302.

The first plenum 204 is located above the first heat exchange fluid conduits 202 and under the cover 400. The first plenum 204 receives a first gas from the gas delivery apparatus. In this embodiment, the first heat exchange fluid conduits 202 are arranged parallel to each other. This parallel arrangement of the first heat exchange fluid conduits 202 is only an example, not a limitation. The first gas channels 201 are also arranged in parallel to each other. The first gas channels 201 can also be arranged in other manners. Each the first gas channel 201 is arranged interlaced with each the first heat exchange fluid conduit 202, and the first heat exchange fluid conduits 202 are arranged in substantially parallel to each other throughout the upper gas spray portion 200 such that the heat exchanging fluid flowing through the first heat exchange fluid conduit 202 can uniformly regulate the temperature of the upper gas spray portion 200. The first gas channels 201 connect the first plenum 204 to the processing volume of the chamber above the substrate carrier such that the first gas or other gases can flow from the first plenum 204 to the processing volume. In one embodiment, the heat exchange fluid comprises water, the first heat exchange fluid conduits 202 which are arranged in an interlaced manner between the first gas channels 201 can provide uniform and efficient temperature control or cooling effect.

The second plenum 304 is located under the first heat exchange fluid conduits 202 and above the second heat exchange fluid conduits 302. The second plenum 304 receives a second gas from the gas delivery apparatus. In this embodiment, the second heat exchange fluid conduits 302 are arranged parallel to each other. This parallel arrangement of the second heat exchange fluid conduits 302 is only an example, not a limitation. The second gas channels 301 are also arranged parallel to each other. The second gas channels 301 can also be arranged in other manners. Each the second gas channel 301 surrounds the portion of each the first gas channels 201 in the lower gas spray portion 300. The second heat exchange fluid conduits 302 are arranged in substantially parallel to each other throughout the lower gas spray portion 300. Each the second gas channel 301 and each the first gas channel 201 are arranged interlaced with each the second heat exchange fluid conduit 302 such that the heat exchanging fluid flowing through the second heat exchange fluid conduit 302 can uniformly regulate the temperature of the lower gas spray portion 300. The second gas channels 301 connect the second plenum 304 to the processing volume of the chamber above the substrate carrier such that the second gas or other gases can flow from the second plenum 304 to the processing volume. In one embodiment, the heat exchange fluid comprises water, the second heat exchange fluid conduits 302 which are arranged in an interlaced manner between the second gas channels 301 also provide uniform and efficient temperature control or cooling effect thereby prevent the formations of condensates or gas phase particles.

The gas delivery apparatus includes multiple gas sources depending on the process being performed. The vapor may then be mixed with a carrier gas prior to delivery to the chamber. Different gases, such as precursor gases, carrier gases, or others may be supplied from the gas delivery apparatus to the gas treatment apparatus through supply lines. The supply lines may include control valves and flow controllers or other types of controllers to monitor and regulate the flow of gas in each line.

A heat exchanging fluid or water flow through the first heat exchange fluid conduits 202 and the second heat exchange fluid conduit 302 to regulate the temperature of the gas distribution apparatus. The heat exchanging fluid may be circulated through a heat exchanger to control the temperature of the heat exchanging fluid as required to maintain the temperature of the gas distribution apparatus within a desired temperature range.

FIG. 1A is a detailed cross-sectional view of the gas treatment apparatus shown in FIG. 1 according to one embodiment of the invention. As shown in FIG. 1A, each the first heat exchange fluid conduits 202 is arranged above each the second heat exchange fluid conduit 302 while each the first gas channel 201 and each the second gas channel 301 are arranged between two adjacent first heat exchange fluid conduits 202 in the upper gas spray portion 200 and two adjacent second heat exchange fluid conduits 302 in the lower gas spray portion 300. The portion of each the first gas channel 201 under the upper gas spray portion 200 is enclosed or surrounded by each the second gas channel 301.

Figure 1B:
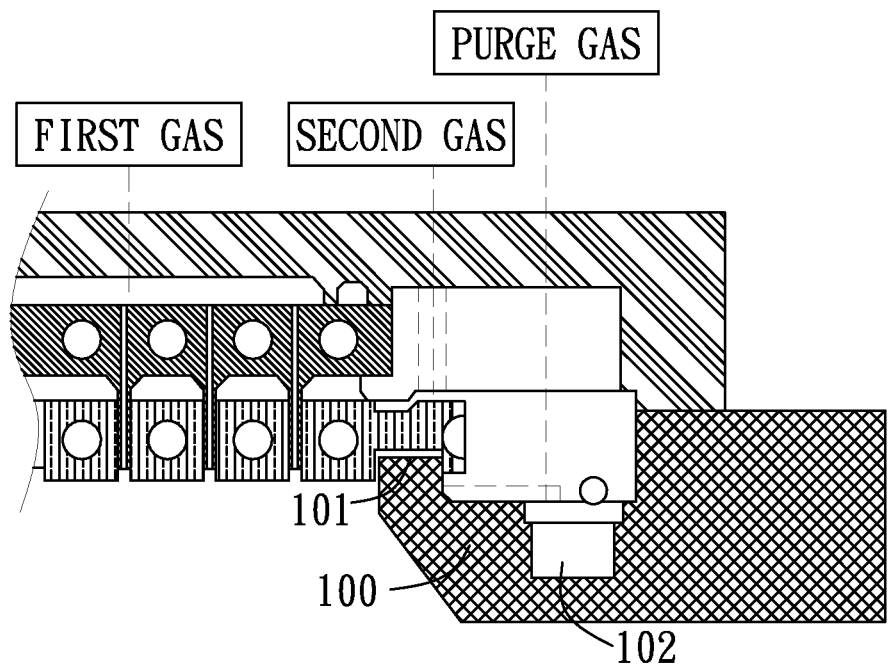
FIG. 1B is another detailed cross-sectional view of the gas treatment apparatus shown in FIG. 1 according to one embodiment of the invention.

FIG. 1B is another detailed cross-sectional view of the gas treatment apparatus shown in FIG. 1 according to one embodiment of the invention. As shown in FIG. 1B, the exterior circular gas channel 101 of the exterior circular gas spray portion 100 is arranged in a circular manner around the multiple combination of the first gas channels 201 and the second gas channels 301 to provide a circular gas curtain surrounding all combination gas curtains each comprising a first gas curtain enclosed by a second gas curtain when the gas delivery apparatus supplies gases to the gas treatment apparatus. In one embodiment, the exterior circular gas spray portion 100 connects to the gas delivery apparatus such that the purge gas from the gas delivery apparatus can flow through the exterior circular gas channel 101. The purge gas comprises an inert gas. The purge gas from the gas delivery apparatus flows into exterior circular gas channel 101 and moves downstream toward the substrates in the processing volume under the gas distribution apparatus.

FIG. 1C is a partial and sectional view taken along line C-C in FIG. 1. In FIG. 1C, the feature of each the first gas channel 201 surrounded or enclosed by each the second gas channel 301 is clearly shown. FIG. 1C also shows each combination of the first gas channel 201 and the surrounding second gas channel 301 is arranged parallel to each other. However, such parallel arrangement is only an example, not a limitation. Furthermore, the distance between two laterally adjacent combinations of the first gas channel 201 and the surrounding second gas channel 301 can also be designed to facilitate temperature regulation of the gas distribution apparatus. Similarly, the distance between two linearly adjacent combinations of the first gas channel 201 and the surrounding second gas channel 301 can also be designed to facilitate temperature regulation of the gas distribution apparatus. Since the line C-C is actually not taken in the gas treatment apparatus, the view of FIG. 1C is actually a bottom view of the gas treatment apparatus.

FIG. 1D is a partial and sectional view taken along line D-D in FIG. 1. Since the line D-D is above the second plenum 304 and under the upper gas spray portion 200, only the first gas channels 201 are shown. The arrangement of the first gas channels 201 in this embodiment is only an example, not a limitation. Furthermore, the distance between any two of the laterally adjacent first gas channels 201 can also be designed to facilitate temperature regulation of the gas distribution apparatus. Similarly, the distance between any two of the linearly adjacent first gas channels 201 can also be designed to facilitate temperature regulation of the gas distribution apparatus.

FIG. 1E and FIG. 1F show two embodiments of the first gas channel and the second gas channel respectively. In FIG. 1E, both the first gas channel 201 and the second gas channel 301 have a shape of slit with rounded ends. The slit of the second gas channel 301 surrounds the slit of the first gas channel 201. Each the first gas channel 201 and the second gas channel 301 are separated by a wall. The thicknesses of walls may be designed to facilitate temperature regulation of the gas distribution apparatus. In FIG. 1F, only the second gas channel 301 has a shape of slit with rounded ends while the first gas channel 201 comprises a plurality of gas injection holes. The slit of the second gas channel 301 encloses the gas injection holes of the first gas channel 201.

Figure 1G:
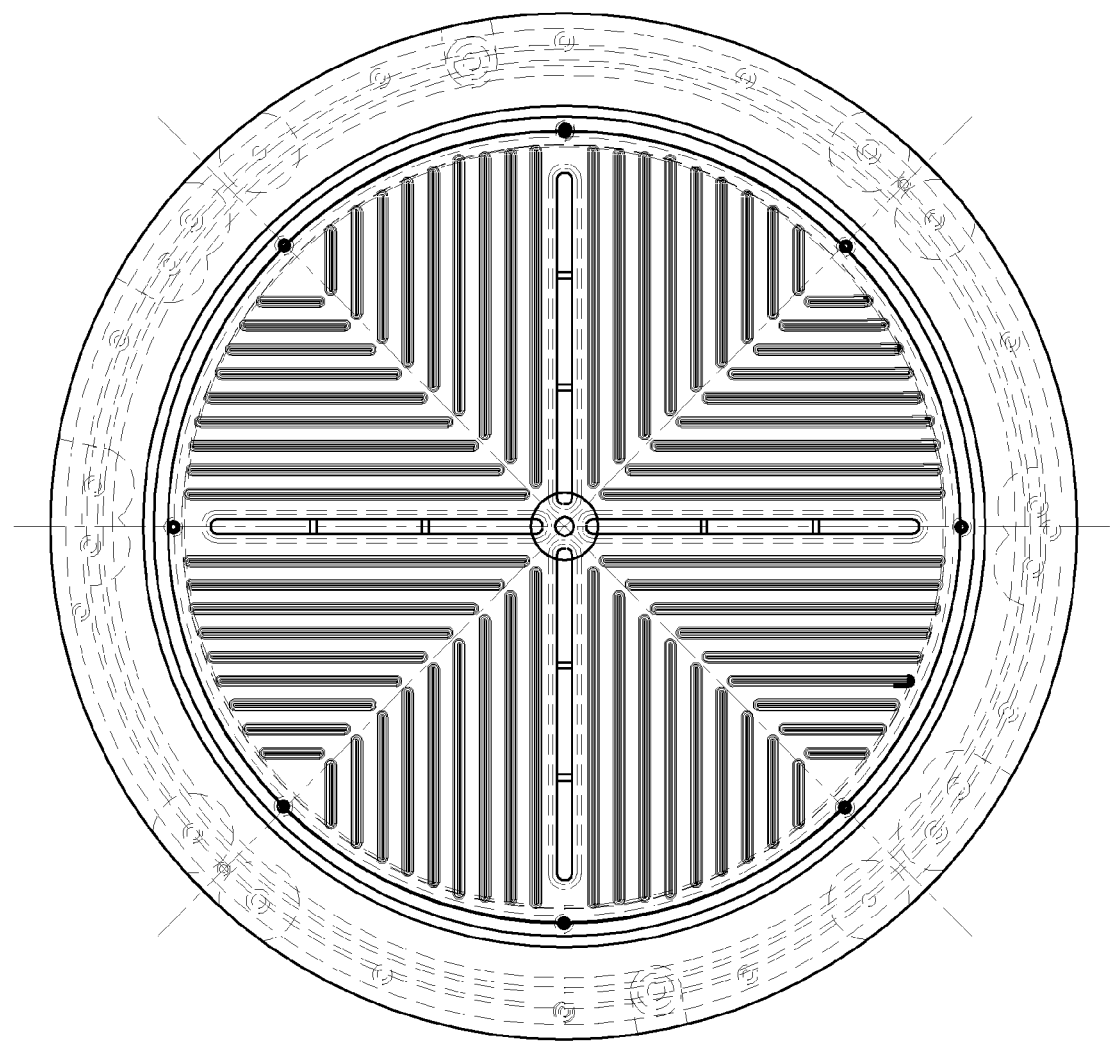
FIG. 1G is a view taken along line G-G in FIG. 1.

FIG. 1G is a view taken along line G-G in FIG. 1. In FIG. 1G, in one embodiment, the gas treatment apparatus is divided into eight regions, wherein each region has a plurality of the combinations of the first gas channel 201 and the surrounding second gas channel 301. It is noted that the number of the regions is not limited to eight regions. In each region, each combination of the first gas channel 201 and the surrounding second gas channel 301 is parallel to each other. As mentioned above, such arrangement is only an example, not a limitation. Furthermore, the distance between two laterally adjacent combinations of the first gas channel 201 and the surrounding second gas channel 301 can also be adjusted according to design requirements of the gas distribution apparatus. The distance between two linearly adjacent combinations of the first gas channel 201 and the surrounding second gas channel 301 can also be designed to meet the design requirements of the gas distribution apparatus. The combinations of the first gas channels 201 and the surrounding second gas channels 301 in adjacent regions respectively are arranged at an angle. In FIG. 1G, the angle is about 90 degree or 180 degree.

The gas distribution apparatus of the invention includes separate gas spray portions each with heat exchange fluid conduits so as to provide uniform and efficient temperature control or cooling effect thereby prevent the formations of condensates or particles in the gas distribution apparatus. The reaction gases are sprayed as gas curtains to improve the quality and efficiency of thin film deposition. The multiple gas curtains are surrounded by an exterior circular gas curtain to achieve the steady gas flows inside the exterior circular gas curtain.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A gas treatment apparatus, comprising
an exterior circular gas spray portion including an exterior circular gas channel for delivering a purge gas;
at least two regions, each region having
an upper gas spray portion having a first plenum, a plurality of first gas channels and a plurality of first heat exchange fluid conduits, wherein the first heat exchange fluid conduits are in a first plate frame of the upper gas spray portion, the first plenum is located above the first heat exchange fluid conduits, the first plenum connects to a gas delivery apparatus, the first heat exchange fluid conduits are arranged substantially parallel to each other throughout the first plate frame, each of the first gas channels is arranged interlaced with each of the first heat exchange fluid conduits; and
a lower gas spray portion comprising a second plenum, a plurality of second gas channels, the first gas channels and a plurality of second heat exchange fluid conduits, wherein the second heat exchange fluid conduits are in a second plate frame of the lower gas spray portion, the second gas channels each having a shape of a slit with rounded ends and being arranged substantially parallel to each other, the second plenum is formed and enclosed by the first plate frame and the plate second frame, the second plenum is located under the first heat exchange fluid conduits and above the second heat exchange fluid conduits, the second plenum connects to the gas delivery apparatus, the second heat exchange fluid conduits are arranged substantially parallel to each other throughout the second plate frame, each of the second gas channels surrounding each of the first gas channels and both are arranged interlaced with each of the second heat exchange fluid conduits, and the second gas channels connect the second plenum to a process chamber, each of the second gas channels surrounds each of the first gas channels to form a combination of the first gas channel and the second gas channel;
wherein each combination of the first gas channel and the surrounding second gas channel in a first region is parallel to each other and extends along a first direction, and each combination of the first gas channel and the surrounding second gas channel in a second region adjacent to the first region is parallel to each other and extends along a second direction, wherein there is an included angle between the first direction and the second direction;
a cover on the exterior circular gas spray portion and the regions, wherein the first plenum is formed and enclosed by the cover and the first plate frame.

2. The gas treatment apparatus of claim 1, wherein the gas treatment apparatus has eight regions.

3. The gas treatment apparatus of claim 1, wherein the first gas channel has a shape of a slit with rounded ends, the slit of the second gas channel surrounding the slit of the first gas channel.

4. The gas treatment apparatus of claim 1, wherein the first gas channel comprises a plurality of gas injection holes, the slit of the second gas channel encloses the gas injection holes of the first gas channel.

5. The gas treatment apparatus of claim 1, wherein each combination of the first gas channel and the surrounding second gas channel is parallel to each other.

6. The gas treatment apparatus of claim 1, wherein the combinations of the first gas channels and the surrounding second gas channels in adjacent regions respectively are perpendicular to each other.

7. The gas treatment apparatus of claim 1, wherein the combinations of the first gas channels and the second gas channels in adjacent regions respectively are parallel to each other.

8. A deposition system, comprising:
a chamber enclosing a processing volume;
a gas delivery apparatus; and
a gas treatment apparatus, comprising
an exterior circular gas spray portion including an exterior circular gas channel for delivering a purge gas;
at least two regions, each region having
an upper gas spray portion having a first plenum, a plurality of first gas channels and a plurality of first heat exchange fluid conduits, wherein the first heat exchange fluid conduits are in a first plate frame of the upper gas spray portion, the first plenum is located above the first heat exchange fluid conduits, the first plenum connects to a gas delivery apparatus, the first heat exchange fluid conduits are arranged substantially parallel to each other throughout the first plate frame, each of the first gas channels is arranged interlaced with each of the first heat exchange fluid conduits;
a lower gas spray portion comprising a second plenum, a plurality of second gas channels, the first gas channels and a plurality of second heat exchange fluid conduits, wherein the second heat exchange fluid conduits are in a second plate frame of the lower gas spray portion, the second gas channels each having a shape of a slit with rounded ends and being arranged substantially parallel to each other, the second plenum is formed and enclosed by the first plate frame and the plate second frame, the second plenum is located under the first heat exchange fluid conduits and above the second heat exchange fluid conduits, the second plenum connects to the gas delivery apparatus, the second heat exchange fluid conduits are arranged substantially parallel to each other throughout the second plate frame, each of the second gas channels surrounds each of the first gas channels and both are arranged interlaced with each of the second heat exchange fluid conduits, and the second gas channels connect the second plenum to the chamber, each of the second gas channels surrounding each of the first gas channel to form a combination of the first gas channel and the second gas channel, the first heat exchange fluid conduits are under the first plenum and all the second heat exchange fluid conduits are under the second plenum; and wherein each combination of the first gas channel and the surrounding second gas channel in a first region is parallel to each other and extends along a first direction, and each combination of the first gas channel and the surrounding second gas channel in a second region adjacent to the first region is parallel to each other and extends along a second direction, wherein there is an included angle between the first direction and the second direction;

a cover on the exterior circular gas spray portion and the regions, wherein the first plenum is formed and enclosed by the cover and the first plate frame.

9. The deposition system of claim 8 wherein the deposition system comprises a metal organic chemical vapor deposition system.

10. The deposition system of claim 8 wherein the first gas channel has a shape of slit with rounded ends, the slit of the second gas channel surrounding the slit of the first gas channel.

11. The deposition system of claim 8 wherein the first gas channel comprises a plurality of gas injection holes, the slit of the second gas channel encloses the gas injection holes of the first gas channel.

12. The deposition system of claim 8 wherein each combination of the first gas channel and the second gas channel is parallel to each other.

13. The deposition system of claim 8 wherein the combinations of the first gas channels and the second gas channels in adjacent regions respectively are perpendicular to each other.

14. The deposition system of claim 8 wherein the combinations of the first gas channels and the second gas channels in adjacent regions respectively are parallel to each other.

15. A gas treatment apparatus, comprising an exterior circular gas spray portion including an exterior circular gas channel for delivering a purge gas;

At least two regions, each region having an upper gas spray portion having a first plenum, a plurality of first gas channels and a plurality of first heat exchange fluid conduits, wherein the first heat exchange fluid conduits are in a first plate frame of the upper gas spray portion, the first plenum is located above the first heat exchange fluid conduits, the first plenum connects to a gas delivery apparatus, the first heat exchange fluid conduits are arranged substantially parallel to each other throughout the first plate frame, each of the first gas channels is arranged interlaced with each of the first heat exchange fluid conduits; and a lower gas spray portion comprising a second plenum, a plurality of second gas channels, and a plurality of second heat exchange fluid conduits, wherein the second heat exchange fluid conduits are in a second plate frame of the lower gas spray portion, the second gas channels each having a shape of a slit with rounded ends and are arranged substantially parallel to each other, the second plenum is formed and enclosed by the first plate frame and the plate second frame, the second plenum is located under the first heat exchange fluid conduits and above the second heat exchange fluid conduits, the second plenum connects to the gas delivery apparatus, the second heat exchange fluid conduits are arranged substantially parallel to each other throughout the second plate frame, each of the second gas channels surrounds each of the first gas channels and both are arranged interlaced with each of the second heat exchange fluid conduits, and the second gas channels connect the second plenum to a process chamber, each of the second gas channels surrounds each of the first gas channels to form a combination of the first gas channel and the second gas channel, and the second heat exchange fluid conduits are under the first heat exchange fluid conduits with the second plenum but without a heat insulation layer therebetween;

wherein each combination of the first gas channel and the surrounding second gas channel in a first region is parallel to each other and extends along a first direction, and each combination of the first gas channel and the surrounding second gas channel in a second region adjacent to the first region is parallel to each other and extends along a second direction, wherein there is an included angle between the first direction and the second direction;

a cover on the exterior circular gas spray portion and the regions, wherein the first plenum is formed and enclosed by the cover and the first plate frame.

16. The gas treatment apparatus of claim 15, wherein the exterior circular gas channel of the exterior circular gas spray portion is arranged in a circular manner around the multiple combination of the first gas channels and the second gas channels to provide a circular gas curtain.

17. The gas treatment apparatus of claim 15, wherein the exterior circular gas channel is for delivering a purge gas.

18. The gas treatment apparatus of claim 15, wherein the first and second heat exchange fluid conduits are for providing cooling effect by using water.

19. The gas treatment apparatus of claim 15, wherein the combinations of the first gas channels and the surrounding second gas channels in adjacent regions respectively are perpendicular to each other.

20. The gas treatment apparatus of claim 15, wherein the combinations of the first gas channels and the second gas channels in adjacent regions respectively are parallel to each other.

* * * * *